(12) United States Patent
Rinaudo et al.

(10) Patent No.: US 6,323,987 B1
(45) Date of Patent: Nov. 27, 2001

(54) CONTROLLED MULTI-WAVELENGTH ETALON

(75) Inventors: Dominic Paul Rinaudo, Blandon; Walter Jeffrey Shakespeare, Macungie; Richard Bendicks Bylsma, Allentown, all of PA (US)

(73) Assignee: Agere Systems Optoelectronics Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/312,387

(22) Filed: May 14, 1999

(51) Int. Cl.$^7$ ........................................ G02B 1/03
(52) U.S. Cl. .................. 359/260; 359/589; 356/346; 250/201.9
(58) Field of Search .................. 359/260, 589; 250/201.9; 356/454, 346, 352; 372/6

(56) References Cited

U.S. PATENT DOCUMENTS 4,170,416 * 10/1979 Fencil ........................... 356/346
5,151,585 * 9/1992 Siebert ......................... 250/201.9
5,289,314 * 2/1994 Siebert .......................... 359/586

* cited by examiner

Primary Examiner—Georgia Epps
Assistant Examiner—Timothy Thompson
(74) Attorney, Agent, or Firm—Darby & Darby

(57) ABSTRACT

A multi-wavelength etalon suitable for tuning and maintaining the operating frequency of a laser used in an optical communication system is disclosed. The communication system has a representative channel wavelength and a channel spacing. The etalon has a plurality of steps on one of the sides with a step size that is a fraction of the channel spacing. The nominal thickness of the etalon is chosen so that a transmission peak occurs at a wavelength substantially equal to the representative channel wavelength and a next peak occurs at the wavelength of an adjacent channel. The step size is a fraction of the channel separation and is substantially optimized so that a peak or trough in the transmission curve in the region of one step overlaps a steep portion of the transmission curve for one or more other steps.

14 Claims, 8 Drawing Sheets

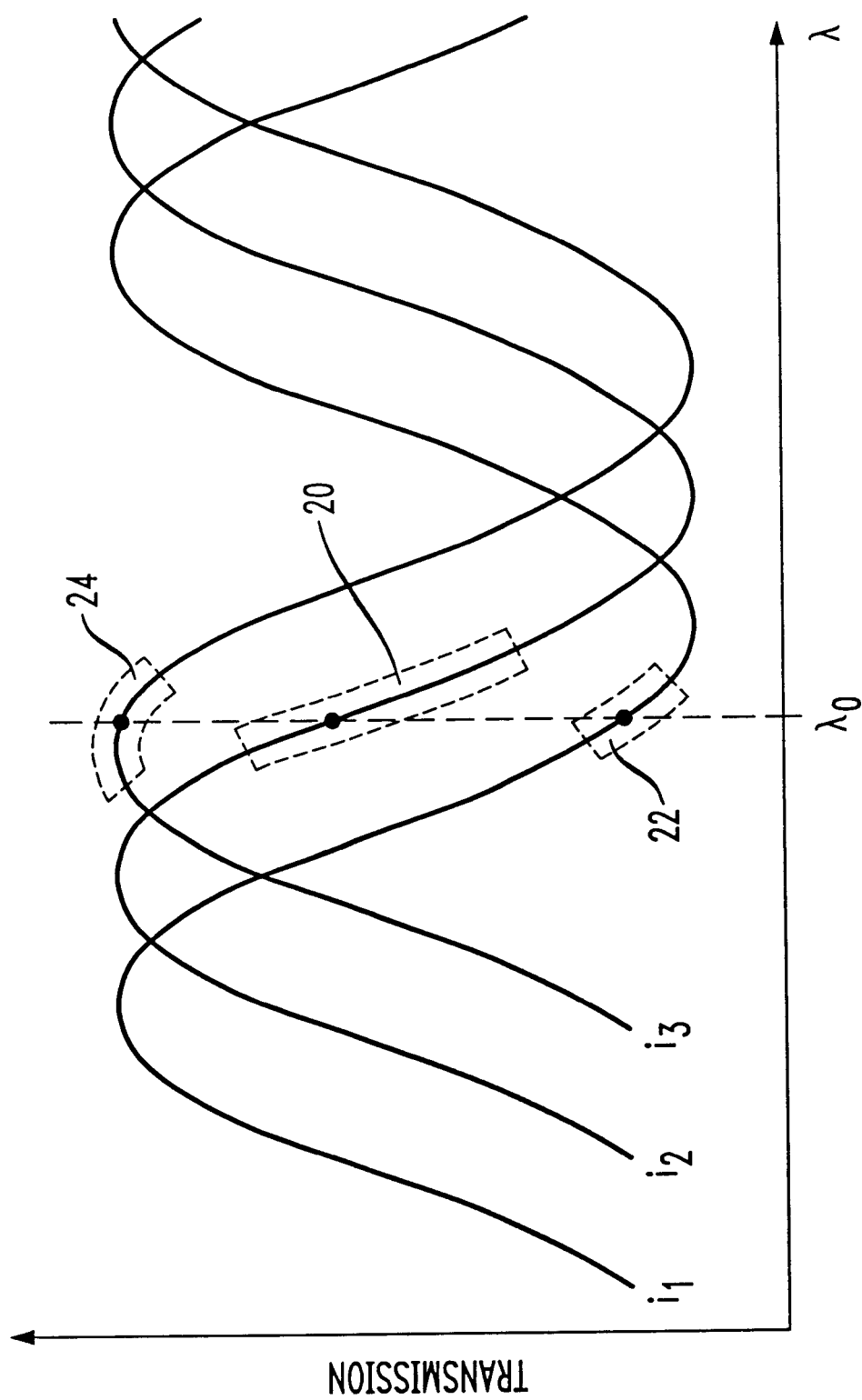

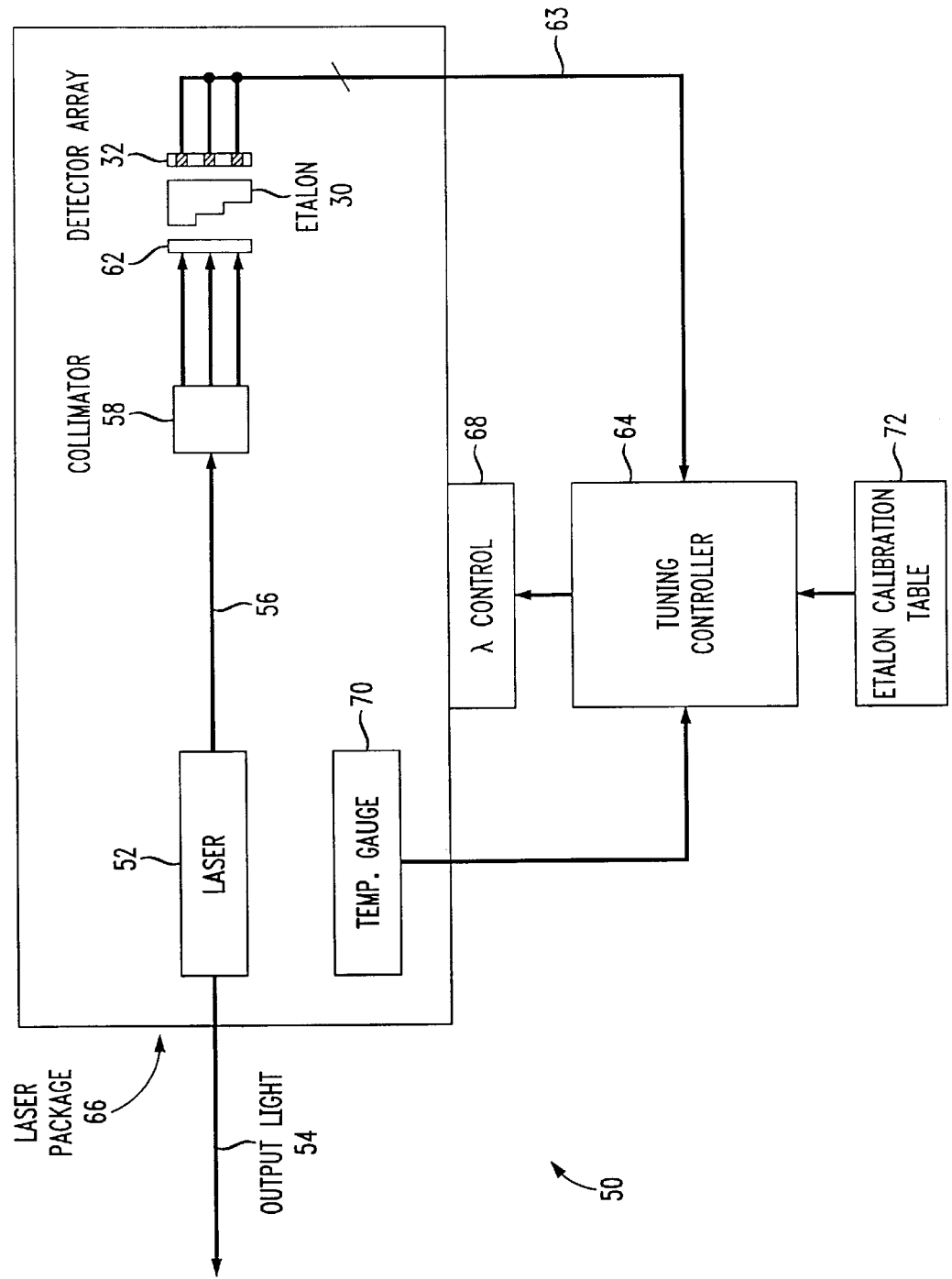

US 6,323,987 B1

CONTROLLED MULTI-WAVELENGTH ETALON

TECHNICAL FIELD

This invention is related to a multi-wavelength etalon for use in stabilizing the wavelength of a laser light source.

BACKGROUND OF THE INVENTION

In many laser applications it is necessary to accurately tune the output of the laser light source to a particular wavelength. For fiber optic communications in particular, accurate tuning of the communication lasers is necessary to permit adjacent transmission channels to be closely spaced, often at wavelengths differing by only 0.4 nanometers. For such closely spaced channels, a laser's wavelength must be tuned to the assigned channel with an accuracy of +/−0.1 nanometers or less. One method of accurate laser tuning uses an etalon having an appropriate thickness to discriminate between various input wavelengths. For accurate results, the thickness of the etalon must be controlled very precisely.

FIG. 1 is a illustration of a conventional etalon 10. The etalon has two partially reflective parallel surfaces 12, 14 separated by a distance d and is comprised of a material with an index of refraction r. When collimated light having a wavelength λ is passed through the etalon, some of the light is reflected from the surfaces 12, 14. The multiply reflected light beams interfere, either constructively or destructively, with each other, and thus alter the overall intensity of the light which passes through the etalon 10. Maximum transmission occurs when twice the distance between the reflective surfaces 12, 14 is an integral number of wavelengths λ in the etalon. In other words, $2d*r/\lambda=x$, where x is an integer. The transmission characteristics of etalon 10 are illustrated in the graphs of FIGS. 2a and 2b. As shown, the transmission characteristic is a periodic function of wavelength and the percentage of reflectivity R of the partially reflective surfaces 12, 14. The thickness d and refractive index r of the etalon determine the distance between the peaks around a given wavelength. The reflectivity R determines the percentage of the light that is reflected by the etalon walls. This defines the amount of light which is available for constructive and destructive interference, and thus how narrow or broad the transmission peaks are.

In order for an etalon to be used to tune the frequency of a light source, the intensity of the transmitted light must be determined. Typically, this is accomplished through the use of a photodetector 16. The intensity of the output light as measured by the photodetector 16 is compared to the intensity of a reference beam and the difference is used to generate an error signal that is used to adjust the wavelength of the light produced by the laser, for example, by varying the laser's operating temperature.

Optimal control over wavelength is provided when a large change in the transmission intensity of an etalon occurs over a small change in wavelength. In other words, optimal control is achieved when the slope of the transmission curve is steepest, such as region 20 shown in FIG. 2a. As the slope of the curve lessens towards a peak or trough, shown as regions 22, the transmission intensity varies to a lesser degree with changes in wavelength and the intensity measurement provides only marginal control. At wavelengths which are approximately at a peak or trough 24 of the transmission curve, the transmitted intensity varies very little with changes in wavelength and little or no useful control information is provided by the etalon. Therefore, in order for a conventional etalon to be useful in calibrating the frequency of a light input source, the distance d between the reflective surfaces must be controlled to a very high degree of accuracy so that the wavelength of interest, $\lambda_0$, falls within a steep slope region 20 of the transmission curve.

It is not unusual for conventional applications to require the etalon thickness d to be accurate to an order of one part per million or more. Producing etalons having a thickness controlled to this level of accuracy generally results in a low manufacturing yield because even very small changes in the total thickness of the device result in large effects. In addition, the operating characteristics of an etalon are highly temperature dependent. Thus, when used, the etalon's temperature must be precisely controlled to prevent changes in thickness due to thermal expansion. In systems where the wavelength of the laser being tuned is adjusted by controlling the operating temperature of the laser, the etalon cannot be housed in the same thermal chamber as the laser because the temperature changes will also affect the transmission characteristics of the etalon. Instead, the etalon must be housed in its own thermally controlled chamber which maintains the etalon at a predetermined temperature. This increases both the cost and the complexity of an etalon-based laser tuning assembly. In addition, because the relative thickness of the etalon is dependent on the angle of the incident light, it is necessary to accurately position the etalon so that the incident light is normal to the surface, a task whose difficulty is increased when the laser and etalon are separately housed.

Alternative etalon structures are also relatively complex and expensive. For example, hollow etalons with mechanisms to physically adjust the position of one of the reflecting surfaces or multi-etalon devices with mechanisms to adjust the position of one etalon relative to another are used to provide some degree of temperature compensation. However, they are complex to build and control and each can cost tens of thousands of dollars. Similarly, wedge-shaped etalons, while providing a variety of thicknesses over the width of the wedge, are difficult to fabricate with an accurate wedge angle and devices for controlling the entry point of the light into the wedge, so as to strike an area with the desired thickness, are also complex and expensive.

Because etalons transmit light of only particular wavelengths, they are also used as spectral sensors to indicate when certain wavelengths of light are present in a given light beam. It is known to provide an etalon with a stepped surface so that a single device can be used to detect several different frequencies of light. Stepped spectrographic etalon arrangements of this type are shown in U.S. Pat. No. 4,822,998 to Yokota et al. and U.S. Pat. No. 5,144,498 to Vincent. Etalons used in spectrographic analysis are designed to discriminate across a wide range of wavelengths, typically on the order of wavelength differences of hundreds of nanometers. To accommodate this, the etalon step size must be relatively large and, as a result, the primary transmission peaks between adjacent steps are far apart, typically at least several tens of nanometers.

To allow for accurate sensing of wavelengths within the spectral range, the transmission peaks corresponding to each step must also be well defined and separated from each other to provide sharp, isolated detection signals. Because spectral sensing etalons of this type are optimized for operation across a wide range of wavelengths, they are unsuitable for high precision laser tuning applications where it is necessary to accurately tune a narrow range of laser output frequencies with accuracies of one nanometer or less.

SUMMARY OF THE INVENTION

According to the present invention, a stepped etalon is provided with a thickness and step size optimized for use in tuning laser communication systems. The nominal thickness of the etalon is chosen so that a transmission peak occurs at a wavelength substantially equal to a selected optical communication channel, such as 1550 nm, and a next peak occurs at a wavelength substantially equal to an adjacent communication channel, such as 1550.4 nm for a system with a channel separation of substantially 0.4 nm. Two or more steps are formed on one side of the etalon. The step size is a fraction of the channel separation and is substantially optimized so that a peak or trough in the transmission curve in the region of one step overlaps a steep portion of the transmission curve for one or more other steps. In this manner, for input light having a particular frequency, the transmission curve for at least one of the steps will be in a steep slope portion which provides maximum tuning control. The reflectivity R of the sides of the stepped etalon is between approximately 5%–95%, and most preferably is approximately 40% to provide the best balance between the steepness of the curves and the contrast between the transmission peaks and troughs.

In operation, photodetectors are used to measure the transmitted intensity through the etalon in the region of each step. Because of the overlapping transmission curves, at least one step will have a transmission curve that is in a steep slope region for a particular input wavelength within the designed range of channels. By calibrating a particular stepped etalon using light sources of known wavelengths, a calibration table can be developed which indicates which step provides the best tuning response for a given range of input wavelengths at a particular temperature.

Once such a calibration table has been generated, it can be used along with knowledge of the temperature and input wavelength range to select the best step to use in tuning a laser light source. The selected step may be changed as needed in response to changes in the temperature of the etalon. This capability advantageously allows for the use of a stepped etalon within the same thermal chamber as the laser since the selected step can be changed in response to changes in the laser's temperature made during the tuning process. In addition, the multiple steps provide compensation for manufacturing variances in the overall thickness of the etalon, allowing a much higher manufacturing yield than for conventional etalons, where the absolute thickness must be very precisely controlled.

BRIEF DESCRIPTION OF THE INVENTION

The foregoing and other features of the present invention will be more readily apparent from the following detailed description and drawings of illustrative embodiments of the invention in which:

FIG. 4 is a graph of the transmission characteristics of the stepped etalon of FIG. 3a;

FIGS. 5a and 5b are diagrams of a laser tuning system utilizing the stepped etalon of FIG. 3.

DETAILED DESCRIPTION OF THE PREFERRED EMBODIMENTS

Figure 3A:
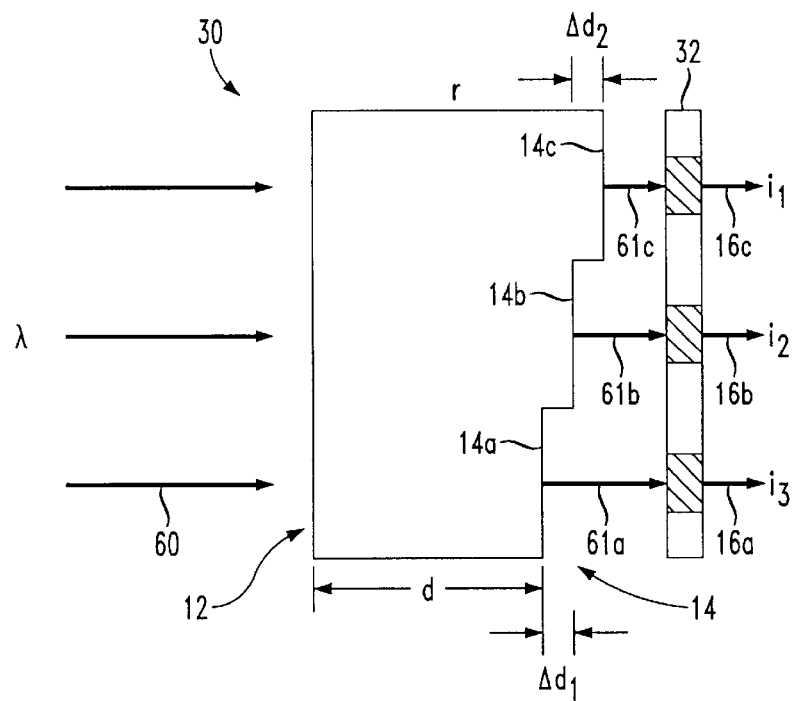
FIGS. 3a and 3b are diagrams of a stepped etalon according to the present invention.

Turning to FIG. 3a, there is shown a stepped etalon 30 according to the present invention which is suitable for tuning lasers used in optical communications. The etalon has a nominal thickness d, is comprised of a material which is transparent at least in the range of wavelengths of interest and has an index of refraction r. One side 12 of the etalon is optically flat. The opposing side 14 of the etalon has a series of small steps 14a, 14b, 14c formed in it, each of which is optically flat and substantially parallel to side 12. Although the nominal thickness d is illustrated with respect to the lowest step, 14a, the thickness can be measured with respect to any of the steps. The surfaces of side 12 and steps 14a, 14b, 14c are partially reflecting and have a reflectivity range of between approximately 5% and 95%. In the preferred embodiment, the reflectivity is preferably in the range of 40%.

The nominal thickness d of the etalon 30 (without considering the effect of the steps) is selected according to the wavelength of a representative optical communication channel, the channel spacing cs between the representative channel wavelength and the wavelength of an adjacent channel, and the index of refraction r of the etalon. The nominal thickness d is selected such that there are peaks in the transmission curve at both the given channel wavelength $\lambda$ and the adjacent channel wavelength $\lambda + cs$. Maximum transmission occurs when the etalon thickness d is equal to an integral number of half-wavelengths. Thus, $d = \frac{1}{2} \times x \ast \lambda / r$, where x is an integer. Solving for the thickness d such that transmission peaks occur at both $\lambda$ and $\lambda + cs$ provides:

$$d = \frac{\lambda(\lambda + cs)}{2 \ast r \ast cs} \qquad \text{(Equ. 1)}$$

In a particular example, an optical channel to be tuned has a wavelength of 1550 nm and the channel spacing to the next channel wavelength is approximately 0.4 nm. For an index of refraction r=1.5, the nominal thickness d of the etalon 30 is approximately 2 mm.

Also illustrated in FIG. 3a is a photodetector array 32 having individual photodetectors 16a, 16b, and 16c, which are in alignment with steps 14a, 14b, and 14c. When a collimated light beam 60 is applied to the etalon 30, light 61a, 61b, 61c is transmitted with an intensity dependent on the net thickness of the etalon 30 in the region of each respective step 14a, 14b, 14c (i.e., d, d+$\Delta d_1$, and d+$\Delta d_1$+$\Delta d_2$), the wavelength $\lambda$, and the reflectivity of the etalon surfaces. The intensity of the transmitted light 61a, 61b, 61c is detected by the photodetector array, and represented by intensity signals $i_1$, $i_2$, and $i_3$.

The step sizes, $\Delta d_1$, $\Delta d_2$, etc., are selected to less than the channel separation and are preferably optimized so that peaks of the transmission curve associated with each step are shifted relative to each other such that a peak or trough in the transmission curve in the region of one step overlaps a steep portion of the transmission curve for one or more other steps. A graph of the transmission characteristics for the etalon 30 of FIG. 3a, and having step sizes selected in this manner, is illustrated in FIG. 4.

As shown in FIG. 4, at a representative wavelength $\lambda_0$, the transmission in the region of step 14a, as shown in curve $i_3$, is near a peak at a low-slope region 24. In this region, the magnitude of transmitted light varies little with changes in wavelength and therefore is not a useful measure for high precision tuning of the input wavelength around $\lambda_0$. The transmission in the region of step 14c, as shown in curve $i_1$ is in a comparatively low slope region 22 near a trough. In this region, the magnitude of transmitted light varies to some degree with changes in wavelength but is generally not sufficient for high precision tuning of the input wavelength around $\lambda_0$. However, frequency $\lambda_0$ falls directly within a high-slope region 20 on transmission curve $i_2$ for step 14b. In this region, relatively small changes in input frequency around $\lambda_0$ produce large shifts in the magnitude of transmitted light. Thus, under these conditions, the transmission for step 14b provides a measure suitable for use in high precision tuning. It can be appreciated that under different operating conditions, the transmission intensity associated with a different step may provide a more suitable tuning measure.

In the preferred embodiment, the step sizes are selected such that the transmission peaks (or troughs) are offset from one another substantially equally over one-quarter of the wavelength of the transmission curve, where, in an etalon configured as discussed above, one wavelength of the transmission curve is equal to the channel spacing cs at the particular wavelength of interest. For n steps, where n is greater than one, at a nominal wavelength of $\lambda$, a first transmission curve will have a peak at $\lambda$, and the remaining curves will peak at intervals of cs/2n. Using the above example of a nominal wavelength of 1550 nm and a channel spacing of 0.4 nm, a two-step etalon 30 is designed to have a peak at 1550 nm for one step and a peak at 1550.1 nm for the second step. A three-step system has a peak interval of 0.4 nm/6 and so has transmission peaks at approximately 1550 nm, 1550.066 nm, and 1550.133 nm.

To provide such closely spaced transmission peaks, the step size is selected to be a fraction of the nominal wavelength within the etalon. In the preferred embodiment, the difference in width $\Delta d$ between each step is one-half the nominal wavelength in the etalon, $\lambda/r$, further divided by the number of steps. Thus, $$\Delta d = \frac{\lambda}{2rn} \quad \text{(Equ. 2)}$$

For a two-step system in the above example, the etalon step size $\Delta d$ is approximately 258 nm. In a three-step system, the step size $\Delta d$ is approximately 172 nm. Although only 3 steps are illustrated in FIG. 3a, in practice as a large number of steps as needed for a given application can be provided.

Preferably, the step size for each of the steps is substantially equal. However, as shown in Equation 2, the thickness of each step size is dependent on the wavelength being considered. Accordingly, the step size for each step can be optimized with respect to the particular wavelength at which the transmission peak for that step is to occur. Generally, however, the difference in the optimal step size for various wavelengths over a range of channels is negligible and can be ignored.

A stepped etalon 30 according to the invention can be fabricated using conventional optical fabrication techniques known to those of skill in the art. Although a variety of materials may be used, the body of the etalon 30 is preferably formed of silicon dioxide ($SiO_2$), which has an index of refraction of approximately 1.5. The body is formed having a nominal thickness d using conventional techniques, such as growth, etching, or grinding and polishing. Preferably, the steps are formed by growing additional optically flat layers on selected portions of one side 14 of the etalon 30. The additional layers are formed of a material which has an index of refraction that is at least close to the material used for the body of the etalon to preserve the etalon transmission function. For a body which is formed of $SiO_2$, steps may be formed of layers of $SiO_2$ and SiN. Advantageously, various growth techniques for $SiO_2$ and SiN are well known to those of skill in the art, relatively inexpensive, and the thicknesses of the growth layers can be controlled to a very high degree of precision. Alternatively, the steps can be formed using controlled etching techniques.

Figure 1:
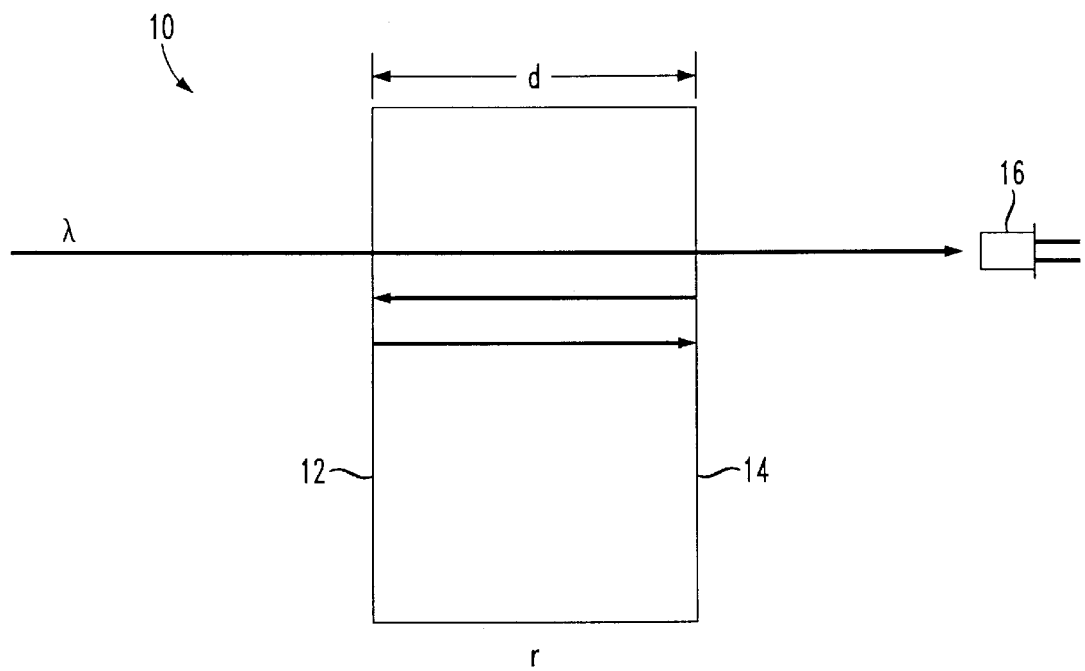
FIG. 1 is a diagram of a conventional etalon.
Figure 2A:
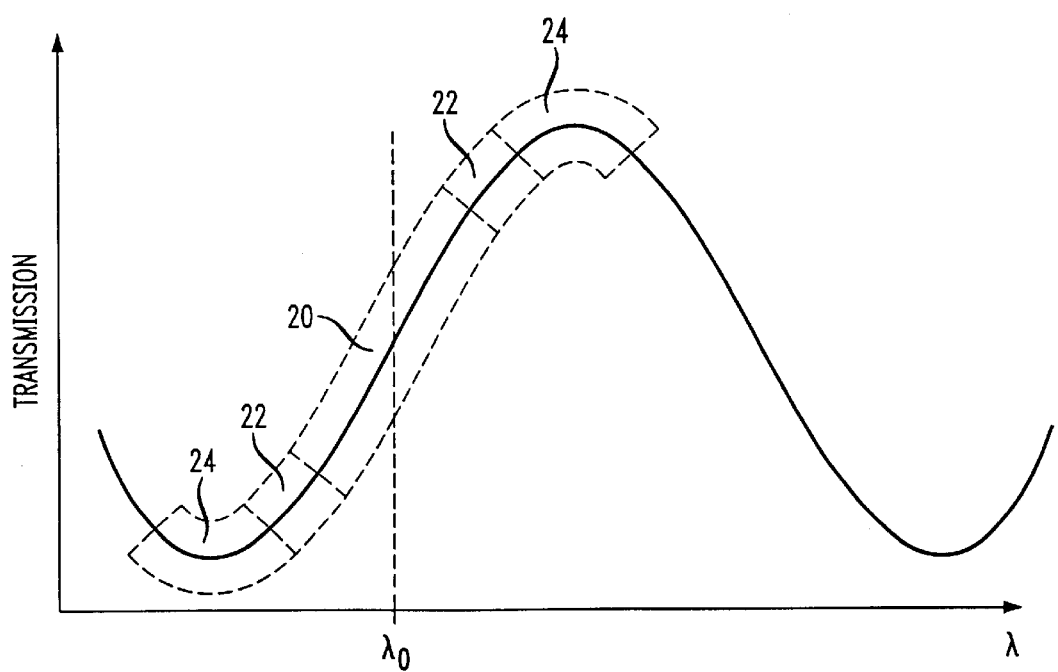
FIGS. 2a and 2b are graphs of the transmission characteristics of the etalon of FIG. 1.
Figure 2B:
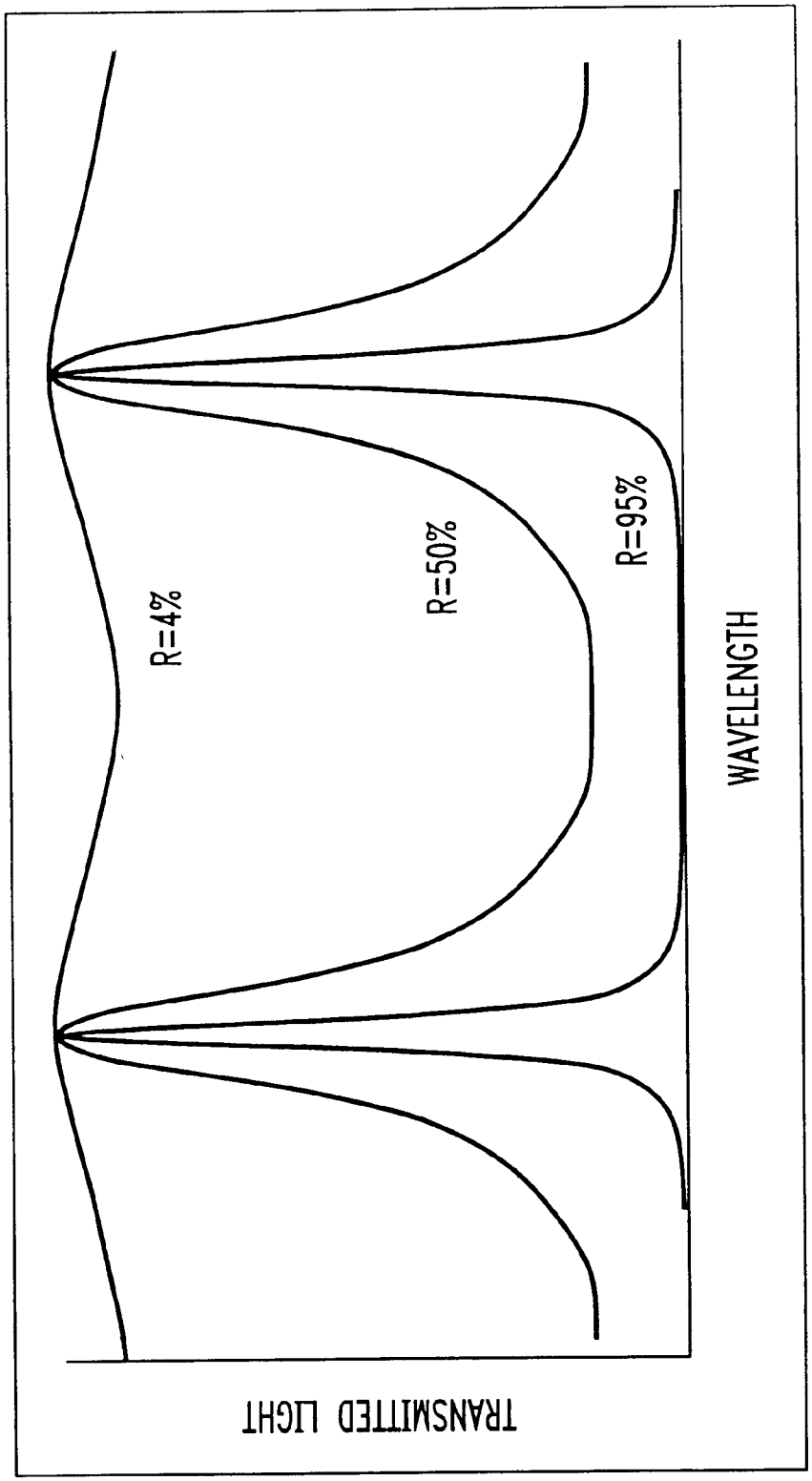

The surfaces of side 12 and the steps 14a, 14b, 14c are treated so as to be partially reflecting using methods known to those of skill in the art, such as by applying a thin layer of silver or aluminum, or depositing a dielectric layer. Preferably, the reflective coatings have a reflectivity in a range of from 5% to 95%. As shown in FIG. 2b, the steepness of the transmission curve between a peak and trough and the intensity contrast between a peak and trough are dependent on the percentage of reflectivity. The width of the relatively steep-slope region is thus also dependent on the reflectivity. The reflectivity R is advantageously chosen to provide the best balance between the curve steepness and the peak/trough contrast for a given application and number of steps. The beam quality, other system details, and particular performance requirements should be considered in determining the optimum reflectivity for a given application. When the incident light is well collimated, a surface reflectivity of approximately 40% has been determined to provide an optimal balance between the steepness of the transmission curve and the peak/trough contrast for a stepped etalon suitable for use in tuning the wavelength of optical communication lasers.

Figure 3B:
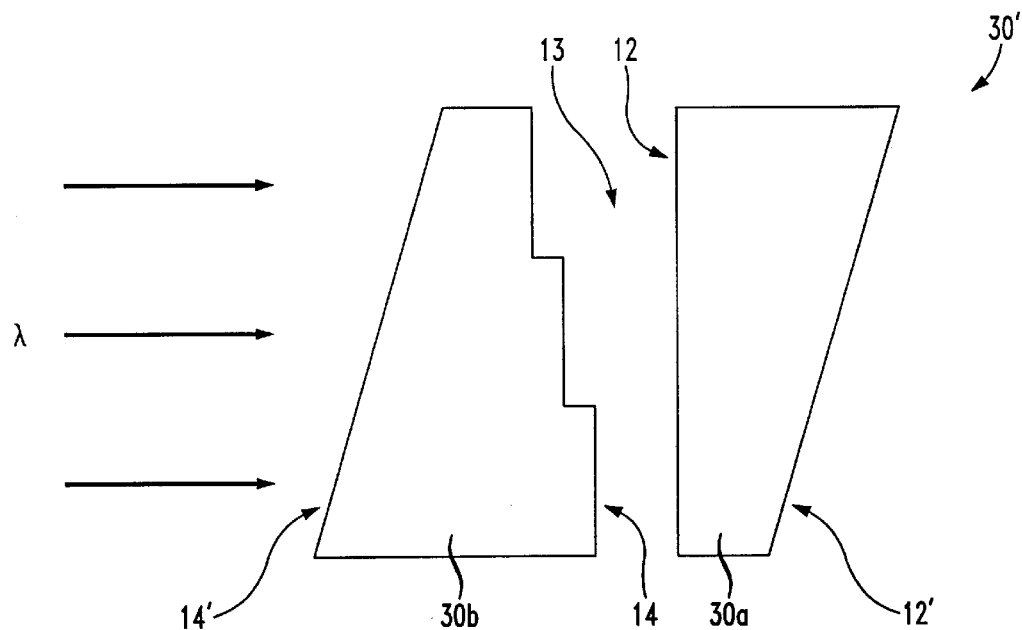

In the preferred embodiment discussed above, the etalon 30 is comprised of a single block of material. However, the present invention is also applicable to etalons of other configurations, such as an air-gap etalon configuration 30' illustrated in FIG. 3b. The air-gap etalon 30' includes at least two separate components 30a, 30b comprised of a material which is transparent at least in the range of wavelengths of interest. The etalon 30' has opposing flat inner side 12 and stepped inner side 14 which are separated by a gap 13 and are configured in the same manner as discussed above. The two blocks 30a, 30b also have outer sides 12' and 14', respectively, which are preferably angled relative to the inner sides and are treated with an anti-reflective coating to limit the reflection of the incoming light. The gap 13 bounded by sides 12 and 14 forms the active portion of the etalon 30'. The transmission characteristics of the etalon 30' are determined by the distance between the two sides 12, 14 and the refractive index of the gas within the gap.

Figure 3C:
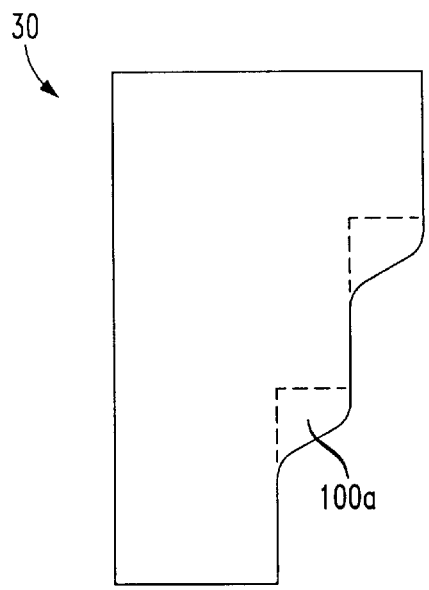
Figure 3D:
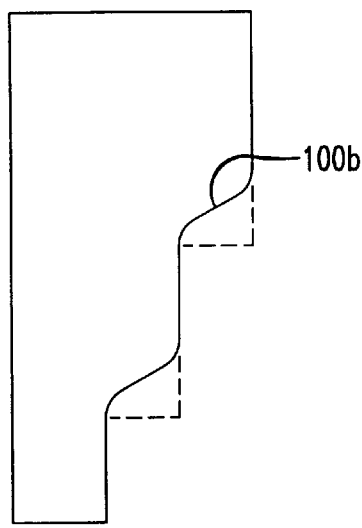

In a preferred implementation, the transitions between adjacent steps 14 of the etalon 30 are not abrupt, but instead are "softened" to reduce diffraction banding, fringing, and other optical effects caused by the presence of sharp transition regions. Such softened step regions 100a, 100b are illustrated in FIGS. 3c and 3d. Various methods for producing gradual transition regions of this type are available and are fully described in a co-pending patent application entitled "Stepped Etalon having Softened Step Transitions," filed concurrently with the present application and assigned to Lucent Technologies, Inc., the entire contents of which is hereby incorporated by reference.

Briefly, softened step transitions can be produced in several ways. After the initial steps have been produced, the entire stepped surface of the etalon 30 can be chemically etched. Because of the greater surface area and increased stresses associated with the step sharp corners, the corners will etch at a faster rate than the flat step plateaus, producing a softened transition region. Alternatively, the stepped region can be coated with a spin-on glass or other material, such as glass-laden epoxy, etc., which has an index of refraction similar to that of the etalon glass. The spin-on material forms a thin coating on the tops of the steps and a thicker coating in the step transitions regions which fills in the abrupt inner corners and rounds the outer corners. In yet another alternative, the etalon can be selectively annealed. Selective application of sufficient heat in the regions of the step transition to produce localized melting will produce a softened transition edge as the melted etalon glass flows and resolidifies.

A gradual transition can also be produced during the step fabrication process. In one method, the steps are etched by means of a directional "abrasive" etching process, such as reactive ion etching. The etching beam is applied to the etalon at an angle, such as 45 degrees, relative to the surface to be etched. The transition region between the resulting steps will have an angle substantially equal to the etch angle. Alternative fabrication techniques, such as the use of an erodable photoresist mask in the region of the step transition, can also be used to produce a softer edge.

Turning to FIG. 5a, there is shown an assembly 50 which is suitable for either calibrating a stepped etalon 30 with a tuned laser 52, or tuning a laser 52 using a calibrated stepped etalon 30. The assembly 50 includes a tunable laser 52 which produces an output light beam 54 and a sample light beam 56 directed at a collimator 58. The resulting collimated light 60 is directed at the stepped etalon 30. In the illustrated embodiment, the output and sample light beams 54, 56 are emitted at opposite ends of the laser 52. Alternatively, a sample light beam can be produced using various techniques known to those of skill in the art, such as via an appropriately placed beam splitter or split fiber coupler.

A photodetector array 32 is placed in alignment with the etalon 30 and produces detection signals 63 which indicate the intensity of light transmitted by each step of the etalon 30. To eliminate interference which can result from light scattered by the corners of the steps of the etalon 30, a scatter reducing apparatus 62, such as an opaque layer having holes aligned with the center of each step, may also be included.

Unlike conventional systems, the laser 52 and the etalon 30 can be housed in a single package 66. A temperature gauge 70 is provided for registering the temperature of the package 66. A laser wavelength control element 68 is provided to adjust the wavelength of the light produced by the laser. Preferably, the laser is thermally tunable and the wavelength control element 68 comprises a temperature controller, such as a heater or thermoelectric cooler, for adjusting the temperature of the package. Alternatively, the laser frequency can be current controlled, wherein the wavelength control element 68 is an appropriate variable current source.

The output of the gauge 70 and the intensity signals 63 are provided as inputs to a tuning controller 64. The tuning controller 64, which may be a conventional microcontroller-based system, adjusts the wavelength of the laser 52 via signals provided to the wavelength control 68. In the case of a thermally controlled laser, the tuning controller 64 adjusts the temperature of the package 66. Because the laser 52 and etalon 30 are in the same package, they will always be at substantially the same temperature.

To tune the stepped etalon, a calibrated laser 52 is provided which has an output of a known wavelength at various temperatures. By measuring the intensity signals 63 at various temperatures and input wavelengths, a calibration table 72 for the specific etalon 30 can be generated by the tuning controller 64, which table contains information about the transmission curve for each of the etalon's steps at particular input wavelengths and temperatures.

Once such a calibration table has been generated, it can be used along with knowledge of the temperature of the thermal chamber and a general input wavelength range to select which step will provide the best intensity signal for use in tuning an untuned laser light source having an approximately known wavelength. As the temperature of the thermal chamber 66 varies, due to changes in ambient conditions or as a result of changes made to precisely tune the wavelength of the laser 52, the dimensions of the etalon also change. By referencing the calibration table 72, the tuning controller 64 selects the best intensity signal from each of the etalon's steps for use in the tuning process at the measured temperature and estimated wavelength.

Figure 5B:
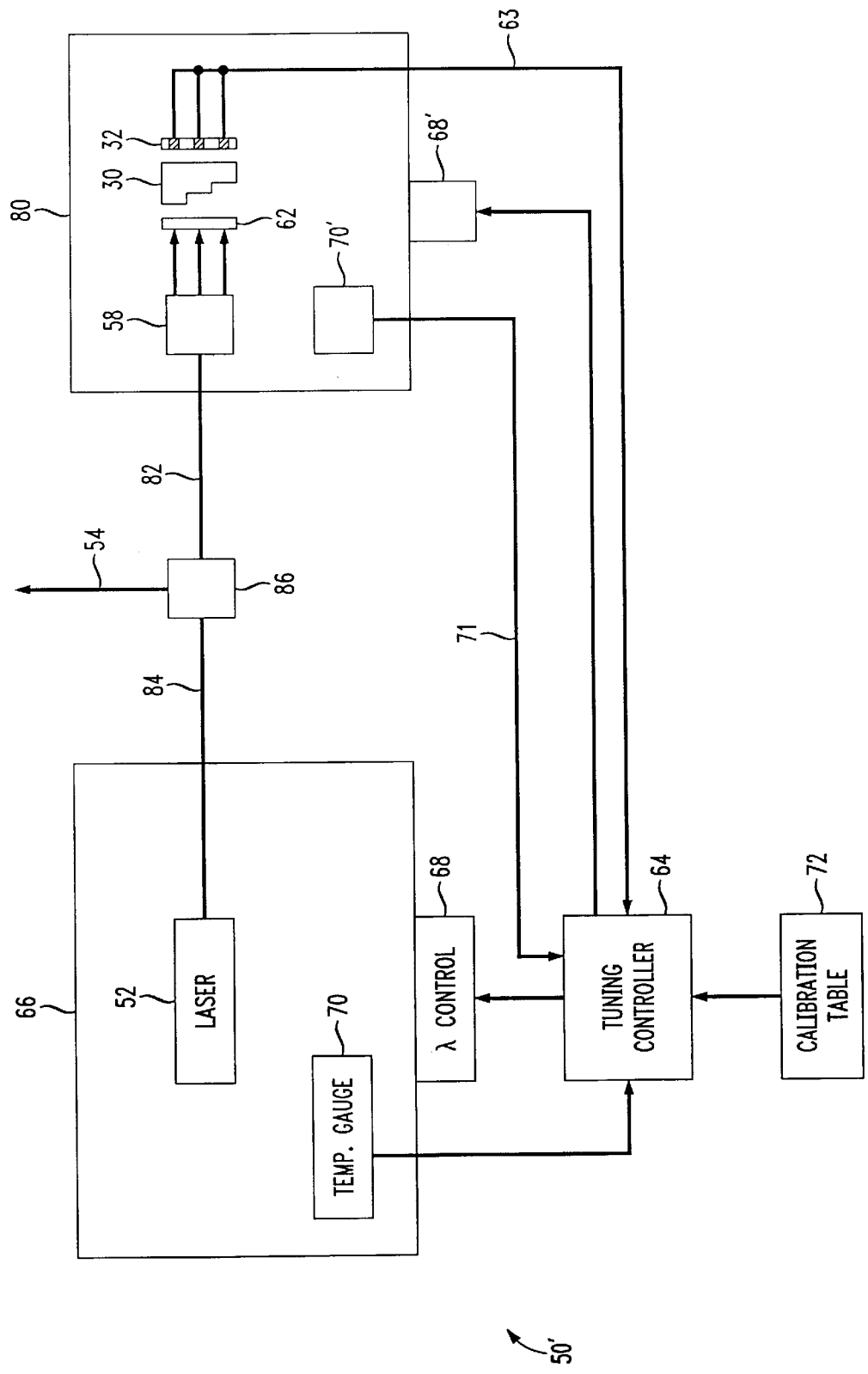

This capability advantageously allows for the use of a stepped etalon within the same package as the laser, since the selected etalon step can be changed in response to changes in the package temperature, e.g., as a result of changes in the laser's temperature made during the tuning process. In addition, because several net etalon thicknesses are provided by the multiple steps, variations in the nominal etalon thickness d (which may not be as precisely controlled as the step size) are compensated for, thus allowing a substantially higher manufacturing yield than for conventional (unstepped) etalons, where the absolute thickness must be very precisely controlled An alternative arrangement 50' for either calibrating a stepped etalon 30 with a tuned laser 52, or tuning a laser 52 using a calibrated stepped etalon 30, is shown in FIG. 5b. In this arrangement, the etalon 30 is outside of the package 66 which houses the laser 52. The etalon 30 and supporting components, such as collimator 58, may be assembled in a discrete manner. Preferably, however, the etalon 30, collimator 58, and scatter reducing apparatus 62 are housed in a separate package 80. The laser package 66 can have a wavelength control unit 68 and a temperature gauge 70, as discussed above. The output of the laser is coupled to an input 82 on the etalon package 80, preferably through a split fiber optic cable 84 and coupler 86.

Preferably, a temperature gauge 70' is used to indicate the temperature of the etalon package 80 to the tuning controller 64 via a signal 71. This indicated temperature is used in conjunction with the calibration table to determine which of the etalon output signals is most appropriate for use in tuning the laser. In one embodiment, the etalon package 80 can be provided with its own temperature control unit 68'. However, the uniquely stepped aspect of the etalon 30 allows it to be used in a variable temperature environment. Thus, in the preferred embodiment, the tuning controller 64 adapts its selection of which particular etalon output signal to use according to the measured temperature. Although temperature gauge 70' is shown within the etalon package 80, it is recognized that the gauge 70' can be placed outside of the package 80, so long as it provides a suitable measurement of the etalon temperature.

Figure 5C:
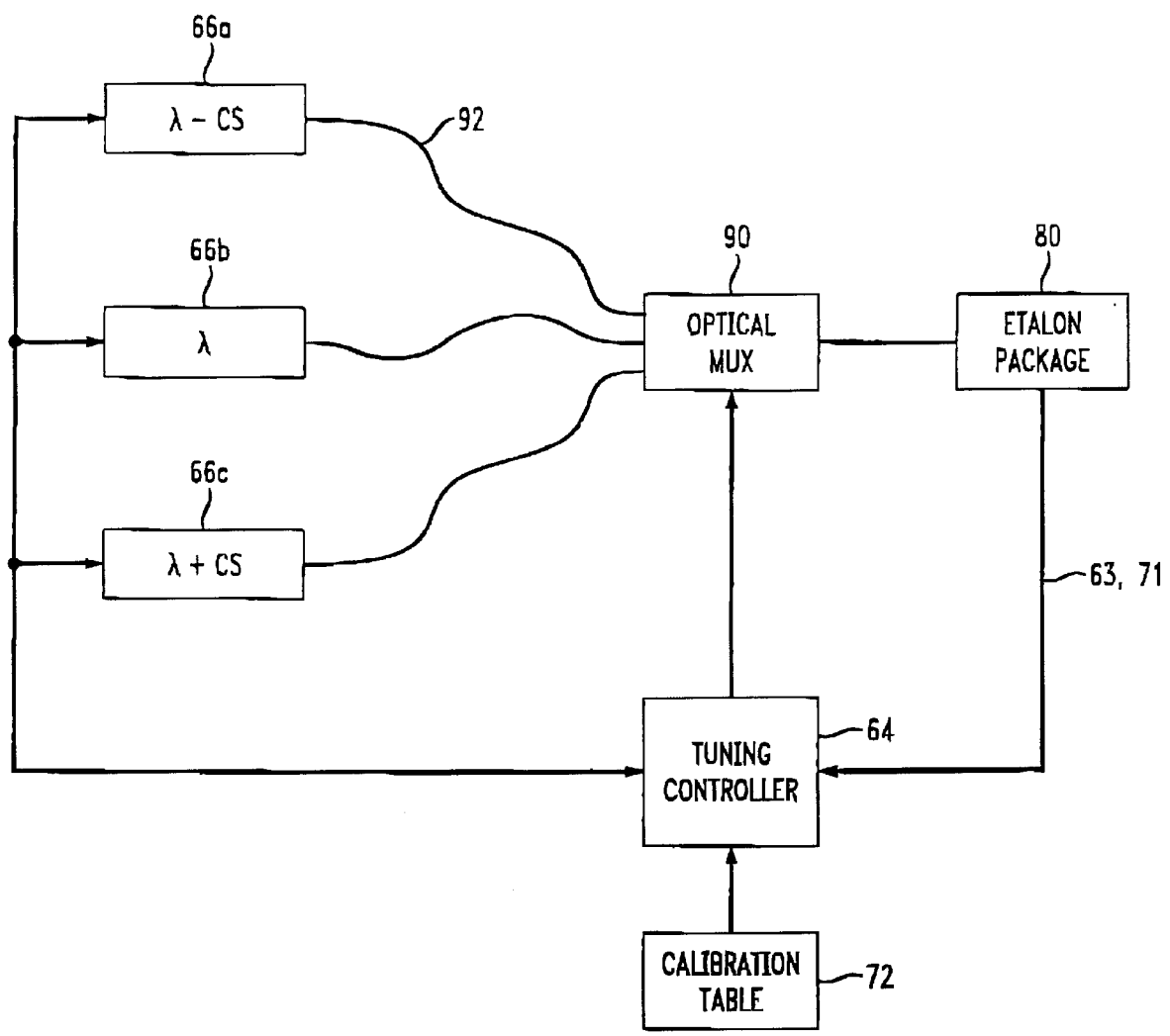
FIG. 5c is a diagram of a plurality of laser packages connected to a single etalon package via an optical multiplexer.

A particular advantage to the configuration shown in FIG. 5b is that a single stepped etalon 30 according to the invention and a single tuning controller 64 can be used to tune a plurality of lasers, where each laser is used, for example, to supply light energy at different channels within an optical communication system. Such a configuration having three laser packages 66a, 66b, and 66c is shown in FIG. 5c. The lasers are configured to supply light energy at, for example, adjacent optical channels having wavelengths λ−cs, λ, and λ+cs, respectively, and each is connected to the tuning controller 64 as shown in FIG. 5b. The optical output from each laser package 66 is coupled to an optical multiplexer 90 through, for example, optical fibers 92. The optical multiplexer 90 then couples light energy from one of the inputs to the etalon package 80 according to inputs received from the tuning controller 64. Unlike conventional etalons, which are useful for tuning lasers only in a very limited range of wavelength, the stepped etalon 30 according to the invention is suitable for tuning lasers over a number of adjacent channels around the center design frequency. By appropriately controlling the optical multiplexer, switching the inputs and outputs to the lasers packages 66a–66c, and selecting the proper intensity signal from the etalon according to the etalon's temperature and the estimated wavelength of the selected laser, each of the lasers can be accurately tuned in turn. Other advantages to this configuration will be apparent to those of skill in the art.

While the invention has been particularly shown and described with reference to preferred embodiments thereof, it will be understood by those skilled in the art that various changes in form and details may be made therein without departing from the spirit and scope of the invention. In particular, while the operation of the etalon has been discussed with respect to the intensity of transmitted light, it is understood that the etalon according to the invention can also be used in a reflective mode, where the intensity of light that is reflected by the etalon is measured to determine the transfer function.

We claim:

1. A multi-wavelength etalon comprising:
  a body which is transparent at least in a predetermined range of wavelengths and having first and second outwardly facing and opposing sides, the first side having a surface, the second side having a plurality of steps, each step having a surface substantially parallel to the surface of the first side, the surface of the first side and the surfaces of the steps being at least partially reflective;
  the first side and the surface of a particular one of the plurality of steps being separated by a thickness d;
  the difference between the thicknesses separating the first side and the surfaces of a pair of adjacent steps defining a step size $\Delta d$;
  the distance d being selected such that a transmission intensity curve of light transmitted through the etalon in the region of the particular step in response to light being applied substantially normal to the first side of the etalon is at a first relative peak when the applied light is of a first wavelength $\lambda$, is at a second adjacent relative peak when the applied light is of a second wavelength $\lambda$+cs; and
  wherein the step size $\Delta d$ is less than cs.

2. The etalon of claim 1, wherein the reflectivity of the partially reflective surfaces is between approximately 5% and 95%.

3. The etalon of claim 2, wherein the reflectivity of the partially reflective surfaces is approximately 40%.

4. The etalon of claim 1, wherein peaks of transmission intensity curves indicating the magnitude of light transmitted through the etalon in the region of each of said plurality of steps in response to light being applied substantially normal to the first side of the etalon are offset relative to each other such that a peak in the transmission curve associated with one of said plurality of steps overlaps a relatively steeply sloped portion of a transmission curve associated with another of said plurality of steps.

5. The etalon of claim 4, wherein the body has an index of refraction r and the step size $\Delta d$ for each pair of adjacent steps is approximately equal to $\lambda/(2*r*n)$, where n is the number of said plurality of steps.

6. The etalon of claim 1, wherein the first wavelength $\lambda$ corresponds to a wavelength of a representative optical communication channel in an optical communications system having a plurality of communication channels, and cs corresponds to the difference in wavelength between the representative channel wavelength and the wavelength of an adjacent optical communication channel.

7. A multi-wavelength air-gap etalon comprising:
  first and second body components separated by a gap and being transparent at least in a predetermined range of wavelengths;
  the first body component having a first outwardly facing side and a first inwardly facing side;
  the second body component having a second outwardly facing side and a second inwardly facing side;
  the first inwardly facing side having a plurality of steps, each step having a surface substantially parallel to the second inwardly facing side, the surface of the second inwardly facing side and the surfaces of the steps of the first inwardly facing side being at least partially reflective;
  the second inwardly facing side and the surface of a particular one of the plurality of steps of the first inwardly facing side being separated by a gap distance d;
  the difference between the gap distances separating the second side and the surfaces of a pair of adjacent steps of the first inwardly facing side defining a step size $\Delta d$;
  the gap distance d being selected such that a transmission intensity curve of light transmitted through the etalon in the region of the particular step in response to light being applied substantially normal to the second inwardly facing side of the etalon is at a first relative peak when the applied light is of a first wavelength $\lambda$, is at a second adjacent relative peak when the applied light is of a second wavelength $\lambda$+cs; and
  wherein the step size $\Delta d$ is less than cs.

8. A stepped etalon for use in stabilizing the wavelength of a laser light source producing light for use in an optical communication system, the optical communication system having a first communication channel wavelength of $\lambda$ and a channel spacing of cs, the etalon comprising:
  a transparent body having an index of refraction r and first and second opposing sides, the first side having a surface, the second side having a plurality of steps, each step having a surface substantially parallel to the first side, the surface of the first side and the surfaces of the steps being partially reflective;
  the body having a nominal thickness d separating the first side and the surface of a particular one of the plurality of steps equal to approximately $(\lambda^2+\lambda*cs)/(2*r*cs)$; and
  the difference between the thicknesses separating the first side and the surfaces of a pair of adjacent steps defining a step size $\Delta d$, wherein the step size $\Delta d$ for each pair of adjacent steps is approximately equal to $\lambda/(2*r*n)$, where n is the number of said plurality of steps.

9. The etalon of claim 8, wherein the transparent body is comprised of a glass having an index of refraction approximately equal to 1.5 and d is substantially 2 mm.

10. The etalon of claim 9, wherein the step size is less than or equal to approximately 258 nm.

11. The etalon of claim 8, wherein the transparent body is comprised of $SiO_2$.

12. The etalon of claim 9, wherein the reflectivity of the partially reflective surfaces is between approximately 5% and 95%.

13. The etalon of claim 10, wherein the reflectivity of the partially reflective surfaces is approximately 40%.

14. A multi-wavelength etalon comprising:
- a body which is transparent at least in a predetermined range of wavelengths and having first and second outwardly facing and opposing sides, the first side having a surface, the second side having a plurality of steps, each step having a surface substantially parallel to the surface of the first side, the surface of the first side and the surfaces of the steps being at least partially reflective;
- the first side and the surface of a particular one of the plurality of steps being separated by a thickness d;
- the difference between the thicknesses separating the first side and the surfaces of a pair of adjacent steps defining a step size $\Delta d$;
- the distance d being selected such that a reflection intensity curve of light reflected by the etalon in the region of the particular step in response to light being applied substantially normal to the first side of the etalon is at a first relative peak when the applied light is of a first wavelength $\lambda$, is at a second adjacent relative peak when the applied light is of a second wavelength $\lambda + cs$; and
- wherein the step size $\Delta d$ is less than cs.

* * * * *